United States Patent
Huang

(10) Patent No.: US 9,799,613 B1
(45) Date of Patent: Oct. 24, 2017

(54) LEAD FRAME DEVICE

(71) Applicant: Chang Wah Technology Co., Ltd., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/422,257

(22) Filed: Feb. 1, 2017

(30) Foreign Application Priority Data

Aug. 9, 2016 (TW) .............................. 105212025 U

(51) Int. Cl.
| | |
|---|---|
| *H01L 33/62* | (2010.01) |
| *H01L 23/00* | (2006.01) |
| *H01L 23/544* | (2006.01) |
| *H01L 23/495* | (2006.01) |

(52) U.S. Cl.
CPC ...... *H01L 23/562* (2013.01); *H01L 23/49503* (2013.01); *H01L 23/49537* (2013.01); *H01L 23/49558* (2013.01); *H01L 23/49582* (2013.01); *H01L 23/544* (2013.01); *H01L 2223/5446* (2013.01)

(58) Field of Classification Search
None
See application file for complete search history.

(56) References Cited

U.S. PATENT DOCUMENTS

2013/0221509 A1* 8/2013 Oda ........................ H01L 24/97
257/676

OTHER PUBLICATIONS

US 9,735,330, 08/2017, Oda (withdrawn)*

* cited by examiner

*Primary Examiner* — Thao P Le
(74) *Attorney, Agent, or Firm* — DLA Piper LLP (US)

(57) ABSTRACT

A lead frame device includes a metallic outer frame member, a lead frame package preform, and an encapsulant. The metallic outer frame member includes a pair of spaced apart longitudinal and transverse sections. The lead frame package preform includes at least one die pad surrounded by the metallic outer frame member such that a gap is formed around the die pad within the metallic, and a plurality of spaced apart leads. Each of the spaced apart leads has a first portion connected to the metallic outer frame member, a second portion proximal to and spaced apart from the die pad, a top surface, and a recess indented from the top surface. The encapsulant is filled in the recess. The disclosure also provides a lead frame device assembly.

8 Claims, 6 Drawing Sheets

US 9,799,613 B1

LEAD FRAME DEVICE

CROSS-REFERENCE TO RELATED APPLICATION

This application claims priority of Taiwanese Invention Patent Application No. 105212025, filed on Aug. 9, 2016.

FIELD

The disclosure relates to a lead frame device, and more particularly to a lead frame device including an encapsulant filled in recesses of leads and gap formed around a die pad.

BACKGROUND

Referring to FIG. 1, a conventional quad flat no-lead (QFN) lead frame device 1 is generally made by etching a flat sheet made of copper, an iron-nickel-based alloy, or a copper-based alloy to remove an unnecessary portion. The lead frame device 1 includes an outer frame member 11 and at least one lead frame unit 12. The lead frame unit 12 includes a die pad 13 surrounded by the outer frame member 11, and a plurality of spaced apart leads 14 extending from the outer frame member 11 toward the die pad 13.

When the lead frame device 1 is used as a chip carrier in a chip package, a chip 15 is first adhered to a top surface of the die pad 13, and then wires 16 are formed to interconnect the chip 15 and the leads 14 using wire bounding techniques. Thereafter, a molding material is applied to the die pad 13, the chip 15, the leads 14, and the wires 16 to form an encapsulating layer 17. Then, the encapsulating layer 17 is cured to form the chip package (as shown in FIG. 2). Subsequently, the chip package thus formed is then diced along a scribing line (imaginary lines as shown in FIGS. 1 and 2) to form a packaged chip. The single packaged chip is adapted to be electrically connected to a packaging substrate, such as a circuit board, to form an electric device.

However, the wires 16, which are usually made of silver, have a relatively poor adhesion to the lead frame device 1 made from copper. In order to improve reliability of the chip package, a portion of the leads 14 proximal to the die pad 13, which is depicted by the imaginary line shown in FIG. 1, are electroplated with a noble metal-containing material that has a relatively great adhesion to the silver wires 16, e.g. silver or a nickel-palladium alloy, prior to wire-bonding of the silver wires 16. However, the partially electroplating operation technique makes the manufacture of the packaged chip relatively complicated. In addition, a protecting layer has to be attached to a bottom surface of the lead frame device 1, which is opposite to the top surface of the die pad 13 provided with the chip 15 prior to the electroplating step. The protecting layer has to be removed posterior to the electroplating step. As a consequence, a scrapping step for removing a sticky residue of the protecting layer on the bottom surface is required, which tends to result in scratches on the lead frame device 1 and thus cause damage to the lead frame device 1. Therefore, an additional tin layer will be applied to the bottom surface for compensating the damage and for subsequent connecting with the circuit board. Furthermore, since the encapsulating layer 17 also has a relatively poor adhesion to the substrate for forming the lead frame device 1, the encapsulating layer 17 is likely to peel off the leads 14 of the chip package.

SUMMARY

Therefore, an object of the disclosure is to provide a lead frame device that can alleviate at least one of the drawbacks of the prior art.

According to one aspect of the disclosure, a lead frame device includes a metallic outer frame member, a lead frame package preform, and an encapsulant.

The metallic outer frame member includes a pair of spaced apart longitudinal sections, and a pair of spaced apart transverse sections connected between the longitudinal sections.

The lead frame package preform includes at least one die pad and a plurality of spaced apart leads. The die pad is surrounded by the spaced apart longitudinal and transverse sections of the metallic outer frame member such that a gap is formed around the die pad within the metallic outer frame member. The spaced apart leads extend from the metallic outer frame member toward the die pad. Each of the spaced apart leads has a first portion connected to the metallic outer frame member and distal from the die pad, a second portion proximal to and spaced apart from the die pad, a top surface extending from the first portion to the second portion, and a recess formed in the first portion and indented from the top surface.

The encapsulant is filled in the recesses of the leads and the gap.

According to another aspect of the disclosure, a lead frame device assembly includes a plurality of the lead frame devices arranged in an array in rows and columns. The pairs of the spaced apart longitudinal sections of the lead frame devices of each column is integrally formed and interconnected with each other. The pairs of the spaced apart transverse sections of the lead spaced apart transverse sections of the lead frame devices of each row is integrally formed and interconnected with each other.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
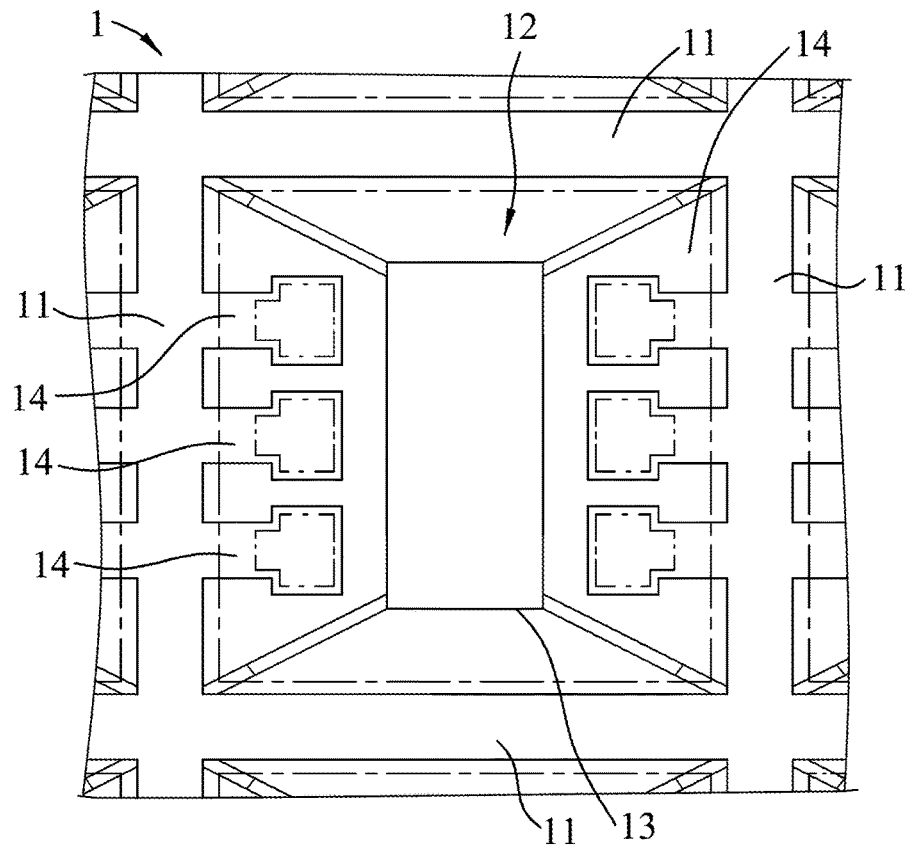
FIG. 1 is a fragmentarily and schematically top view of a conventional quad flat no-lead (QFN) lead frame device.
Figure 2:
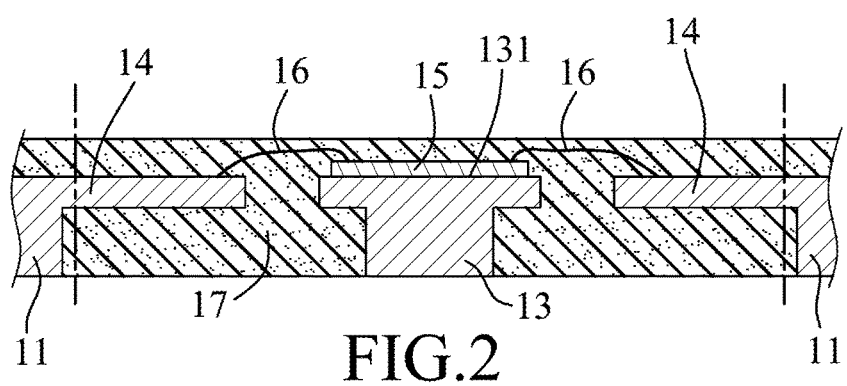
FIG. 2 is a fragmentarily cross-sectional view of a chip package including the conventional QFN lead frame device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
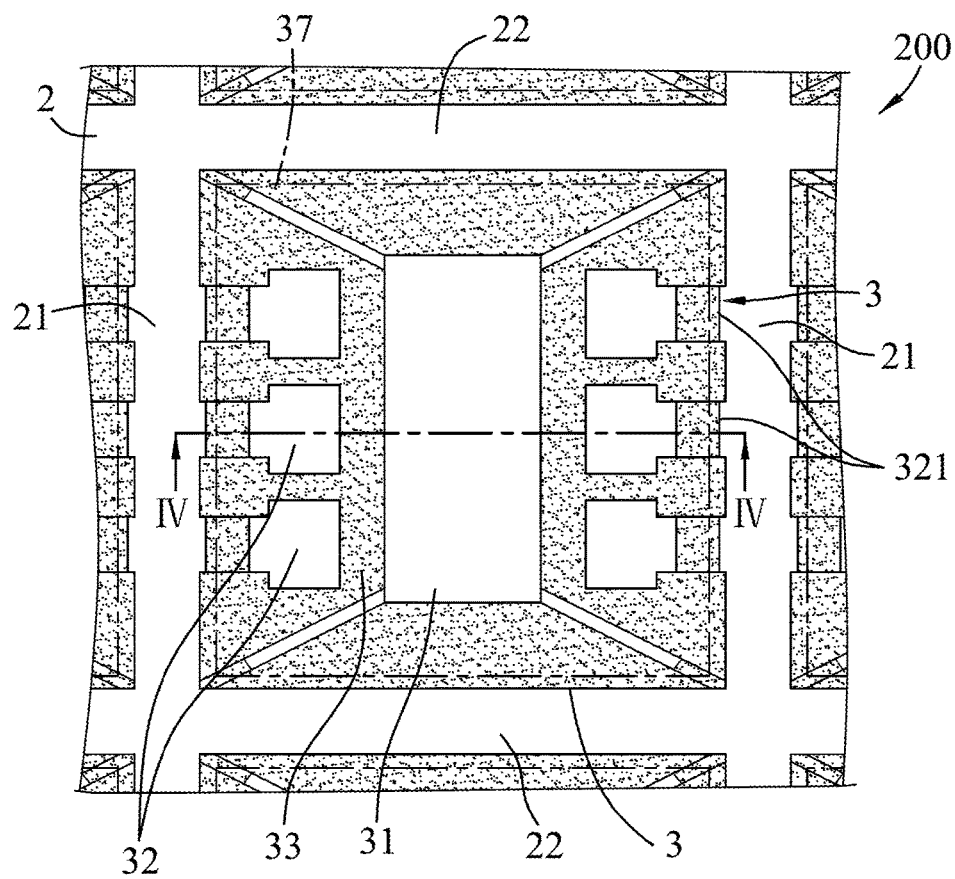
FIG. 3 is a fragmentarily and schematically top view of an embodiment of the lead frame device according to the disclosure.
Figure 4:
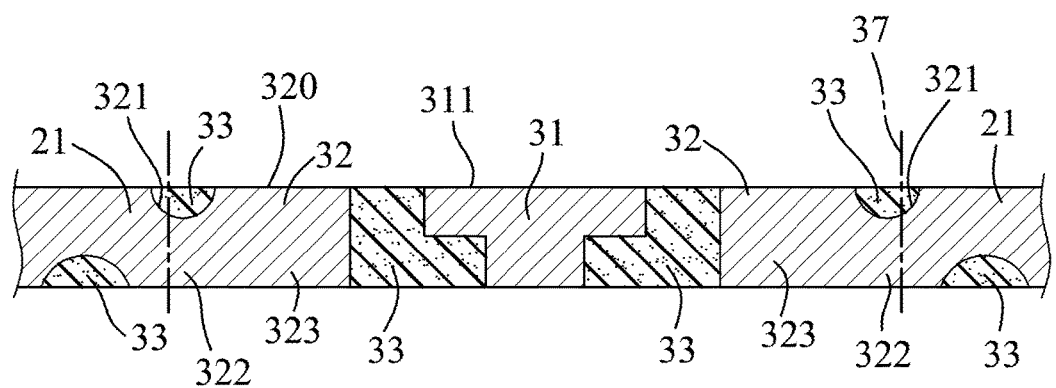
FIG. 4 is a fragmentarily and schematically cross sectional view of the embodiment taken along line IV-IV of FIG. 3.

Referring to FIGS. 3 and 4, an embodiment of a lead frame device 200 according to the disclosure applicable to the field of a semiconductor chip package is illustrated. The lead frame device 200 includes a metallic frame member 2, a lead frame package perform 3, and an encapsulant 33.

The metallic frame member 2 includes a pair of spaced apart longitudinal sections 21, and a pair of spaced apart transverse sections 22 that are connected between the longitudinal sections 21. The metallic frame member 2 is made of a metallic material selectable from copper, a copper-based alloy, or an iron-nickel based alloy.

The lead frame package perform 3 includes at least one die pad 31, and a plurality of spaced apart leads 32. In the embodiment, a number of the die pad 31 is one.

The metallic outer frame member 2, the die pad 31 and the spaced apart leads 32 may be made from the same material. The die pad 31 is surrounded by the spaced apart longitudinal and transverse sections 21, 22 of the metallic outer frame member 2, such that a gap is formed around the die pad 31 within the metallic outer frame member 2. In one form, the metallic outer frame member 2 may include a plurality of the die pads 31 that are surrounded by the outer frame member 2.

The spaced apart leads 32 extend from the metallic outer frame member 2 toward the die pad 31. Each of the spaced apart leads 32 has a first portion 322 that is connected to the metallic outer frame member 2 and distal from the die pad 31, a second portion 323 that is proximal to and spaced apart from the die pad 31, a top surface 320 that extends from the first portion 322 to the second portion 323, and a recess 321 that is formed in the first portion 322 and indented from the top surface 320. The recesses 321 of the first portions 322 of the spaced apart leads 32 are located on a scribing line 37 that is configured to cut off the lead frame package perform 3 from the metallic outer frame member 2.

The encapsulant 33 is filled in the recesses 321 of the leads 32 and the gaps. The encapsulant 33 is made from an insulating polymer material, such as epoxy resin.

A plurality of the lead frame devices 200 may be arranged in an array in rows and columns to form a lead frame device assembly. In this implementation, the pairs of the spaced apart longitudinal sections 21 of the lead frame devices 200 of each column are integrally formed and interconnected with each other, and the pairs of the spaced apart transverse sections 22 of the lead frame devices 200 of each row are integrally formed and interconnected with each other.

Figure 5:
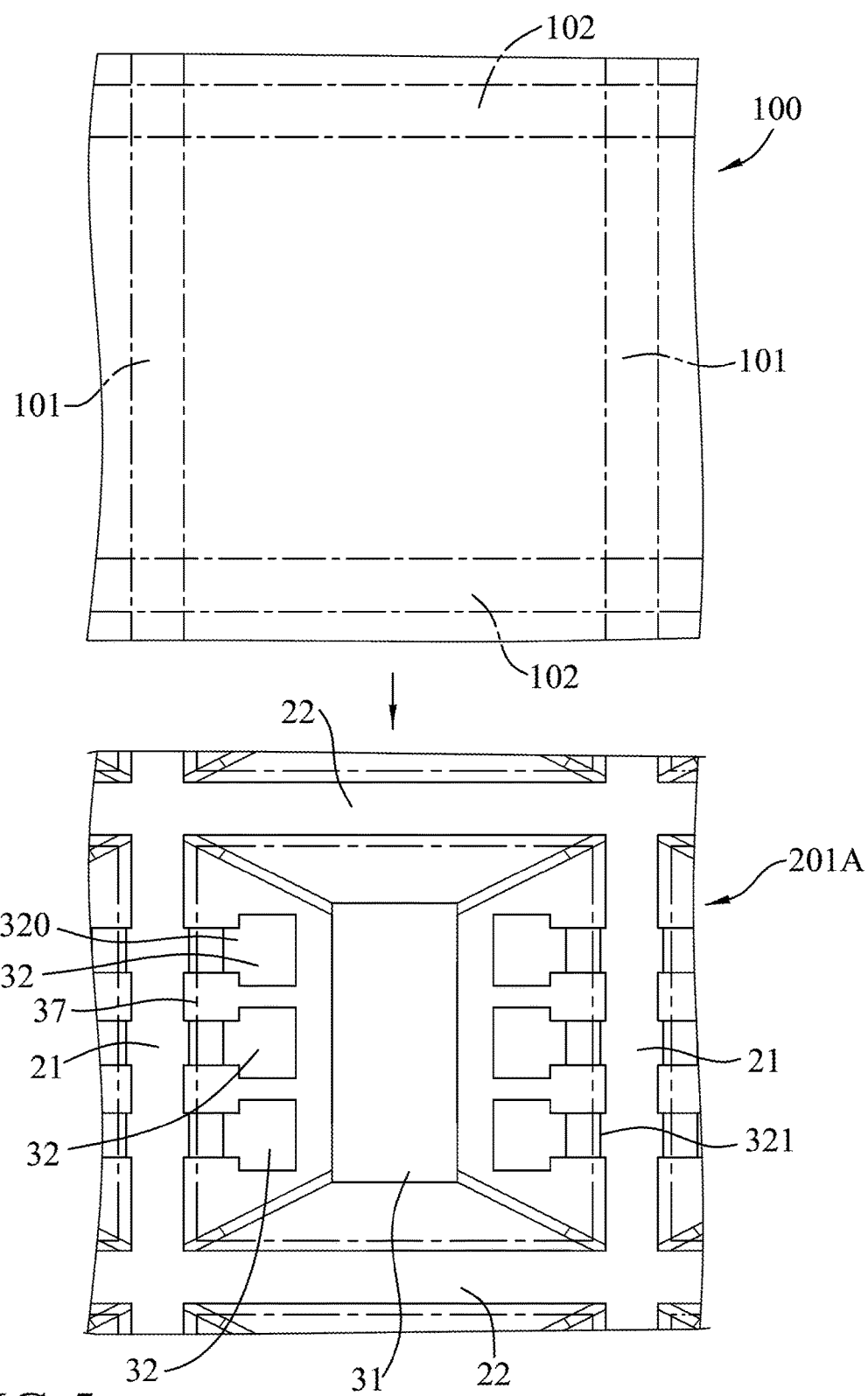
FIG. 5 is a fragmentarily and schematically top view of consecutive steps of a method of making a lead frame device.

Referring to FIG. 5, when the lead frame device 200 is manufactured, a substrate 100 that is made of a conductive material, such as copper, a copper-based alloy or an iron-nickel-based alloy is first provided. The substrate 100 is defined with a plurality of spaced apart longitudinal regions 101 and a plurality of spaced apart transverse regions 102 (only two spaced apart longitudinal regions 101 and two spaced apart transverse regions 102 are shown).

The substrate 100 is then patterned to remove an unnecessary portion using etching techniques to form a preformed lead frame device assembly that includes a plurality of preforms of the lead frame devices 200 (only one perform of the lead frame device 200 is shown).

In more detail, the spaced apart longitudinal and transverse sections 21, 22 of the metallic outer member 2 are in position corresponding to the spaced apart longitudinal and transverse regions 201, 202 of the substrate 100. The recesses 321 of the first portions 322 of the leads 32 are formed using partially etching techniques in the first portions 322 and indented from the top surfaces 320.

It is noted that the shape and detailed structure of the spaced apart longitudinal and transverse sections 21, 22 of the metallic outer frame member 2 are not of the essence of the present disclosure and may be varied by those skilled in the art according to practical requirements and designs.

Thereafter, the preformed lead frame device assembly 201A is disposed in a mold (not shown), and then an encapsulating material is applied to be filled in the recesses 321 of the leads 32 and the gap around the die pad 31 within the metallic outer frame member 2 without covering the top surfaces and bottom surfaces of the leads 32, followed by curing the encapsulating material to form the encapsulant 33 so as to form a lead frame device assembly includes a plurality of the lead frame devices 200.

Figure 6:
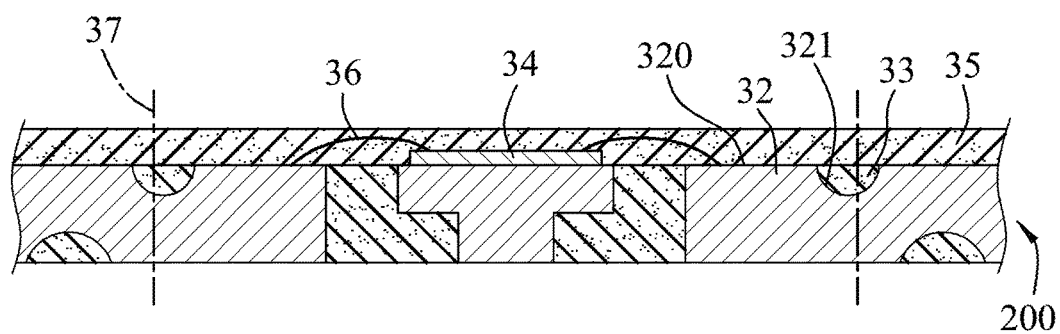
FIG. 6 is a schematically cross-sectional view of an electrical device including the embodiment of the lead frame device.

Referring to FIG. 6, when the lead frame device assembly is in use, chips 34 are first respectively adhered to the die pads 31, followed by subjecting the chips 34 to wire bounding treatment to form wires 36 connecting the chips 34 and the leads 32, and then forming an encapsulating layer 35 on the lead frame devices 200, the chips 34 and the wires 36. Finally, the lead frame devices 200 with the chips 34 and the encapsulating layer 35 are respectively cut off along the scribing line 37. Since the encapsulating layer 35 and the encapsulant 33 are both made of the polymer materials and have relatively great adhesion with each other, the pilling problem encountered by the conventional lead frame device 1 at an interface between the encapsulating layer 35 and the leads 32 can be avoided in terms of adhesion of the encapsulant 33 to the encapsulating layer 35.

Furthermore, by way of formation of the encapsulant 33, a portion of each of the lead frame devices 200, which is not required to be electrically connected to other external components, has been covered by the encapsulant 33. Hence, in case the second portions 323 of the leads 32 of the lead frame package perform 3 of each of the lead frame devices 200 is needed to be further electroplated with a metal layer, such as silver or a nickel-paladium-based alloy, the encapsulant 33 can serve as a mask without use of any additional mask or tape. Formation of scratches on the lead frame devices 200 and damage to the lead frame devices 200 caused thereby can be avoided.

Figure 7:
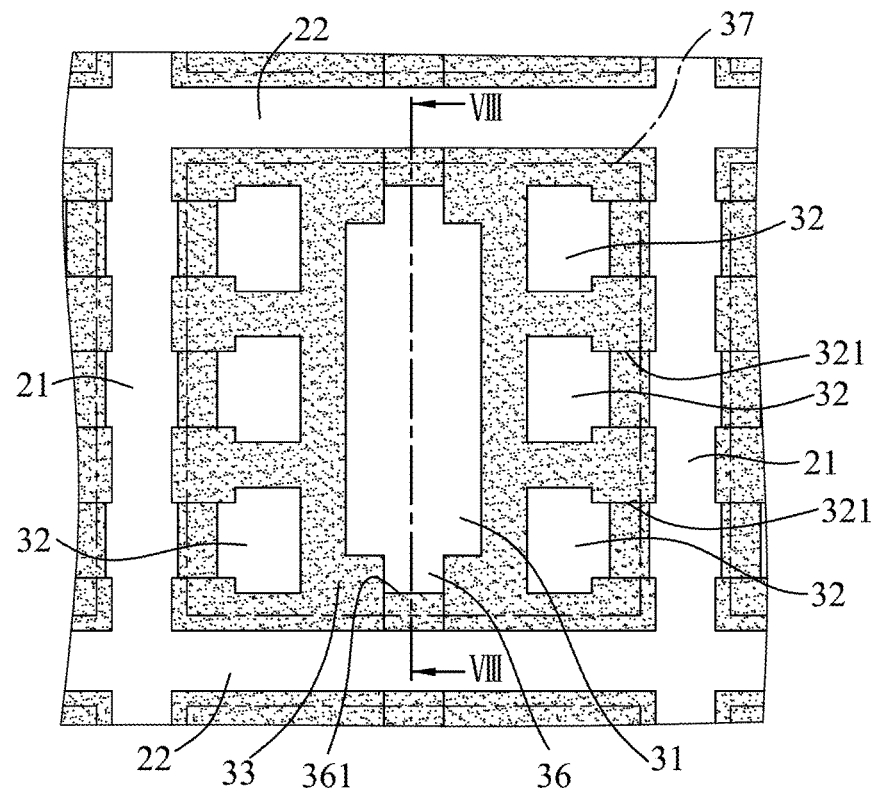
FIG. 7 is a schematically top view of a modification of the embodiment of the lead frame device according to the disclosure.
Figure 8:
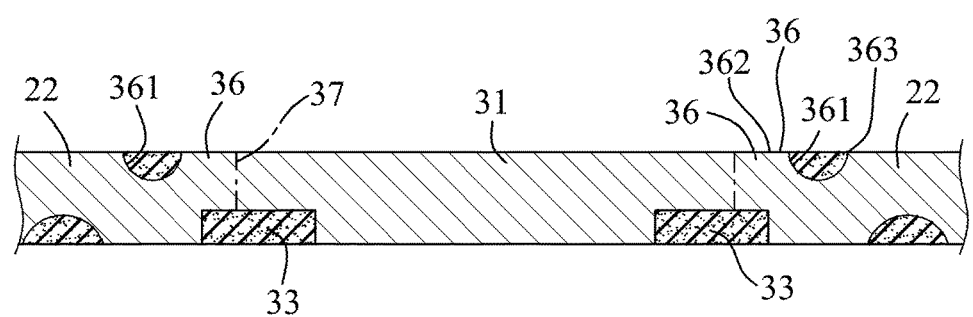
FIG. 8 is a schematically cross-sectional view of the modification taken along line VIII-VIII of FIG. 7.

Referring to FIGS. 7 and 8, a modification of the embodiment of the lead frame device 200 according to the disclosure is illustrated. In this implementation, the lead frame device further includes at least one supporting segment 36. The supporting segment 36 has a segment first end 362 that is connected to the die pad 31, a segment second end 363 that is connected to the metallic outer frame member 2, and a segment top surface 360 that extends from the segment first end 362 to segment second end 363. The segment second end 363 of the supporting segment 36 is formed with a segment recess 361 that is indented from the segment top surface 360 and that is located on the scribing line 37. The encapsulant 33 is further filled in the segment recess 361. In this implementation, the number of the supporting segment is two. The supporting segments 36 are respectively connected to the die pad 31 and a respective one of the transverse sections 22 of the metallic outer frame member 2. Alternatively, the lead frame package perform 3 may include a plurality of supporting segments 36 that respectively interconnect the die pad 31 and the longitudinal sections 21 or the die pad 31 and the transverse sections 22. The die pad 31 can be held by the supporting segments 36, and the encapsulant 33 filled in the segment recess (361) can prevent the encapsulating layer 35 from peeling off.

The recesses 321 of the first portions 322 of the leads 32 and the segment recess 361 of the supporting segments 36 may be formed at the same step using the partially etching techniques.

The etching techniques and the partially etching techniques are well known to those skilled in the art, further details thereof are not provided herein for the sake of brevity.

Figure 9:
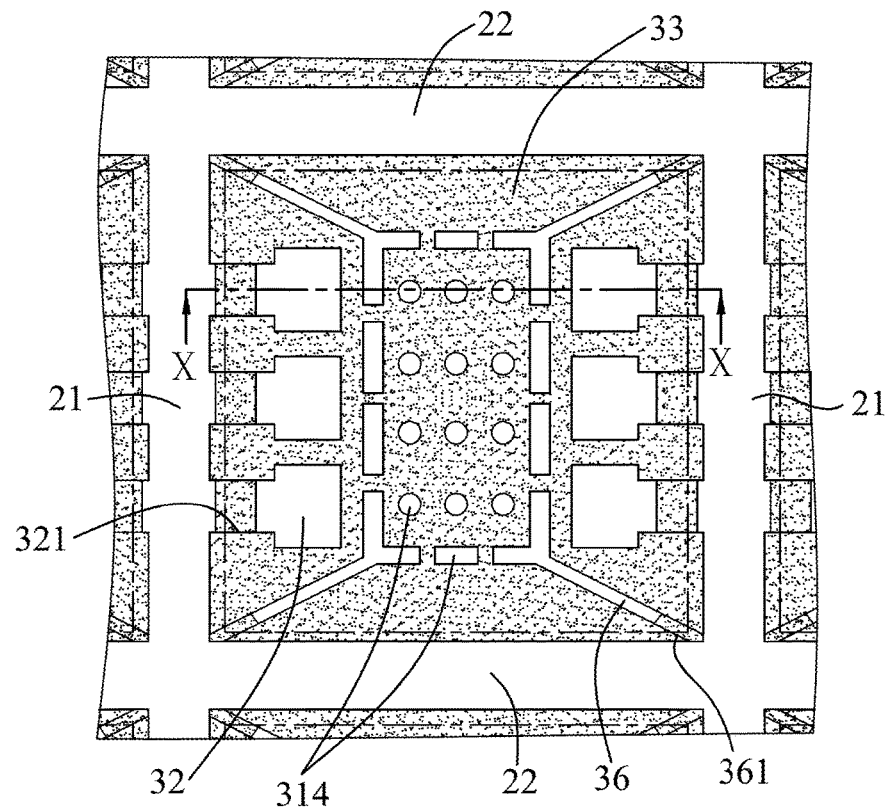
FIG. 9 is a schematically top view of another modification of the embodiment of the lead frame device according to the disclosure.
Figure 10:
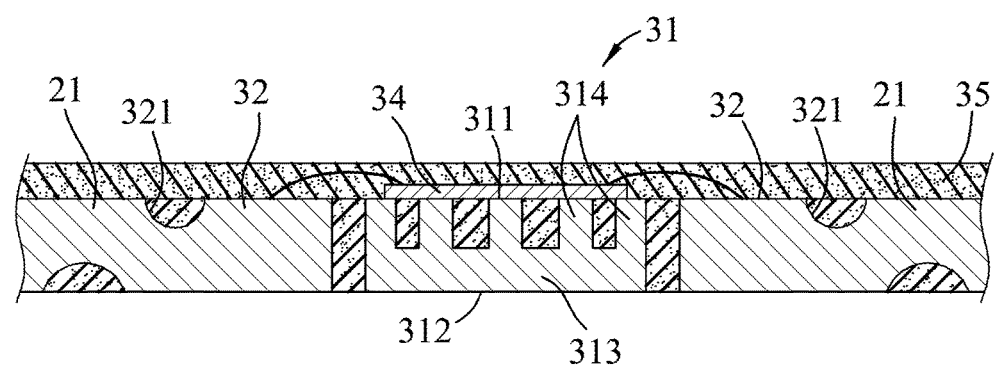
FIG. 10 is a schematically cross-sectional view of the another modification taken along line X-X of FIG. 9.

Referring to FIGS. 9 and 10, another modification of the embodiment of the lead frame device 200 according to the disclosure is illustrated. In this implementation, the die pad 31 includes a base portion 313, and a plurality of spaced apart posts 314 that protrude upward from the base portion 313. The encapsulant 33 is further filled in spaces formed among the posts 314 without covering top surfaces of the posts 314. The base portion 313 and the posts 314 of the die pad 31 may be formed by partially etching the die pad 31. The posts 34 may serve as metal contacts for further processing. Similarly, when the lead frame device 200 is further subjected to the electroplating treatment, such as a silver electroplating treatment, the portion of the die pad 31 which is not intended to be electroplated has been covered and protected by the encapsulant 33, and thus the die pad 31 has desired reliability.

In summary, for each of the lead frame device 200 of the disclosure, by virtue of the design of the recesses 321 of the leads 32, the gap formed around the die pad 31 within the metallic outer frame member 2, the segment recesses 361, and the encapsulant 33 filled in the recesses 321, the gaps and the segment recesses 361, the pilling problem of the encapsulating layer 35 can be eliminated. In addition, the die pad 31 is formed using the partially etching techniques to remove the unnecessary portion and leave the posts 314 (serve as the metal contacts) so that the lead frame package perform 3 can be electroplated without using additional mask, such as the tape. Thus, the lead frame device 200 has desired reliability.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A lead frame device, comprising:
   a metallic outer frame member including a pair of spaced apart longitudinal sections, and a pair of spaced apart transverse sections connected between said longitudinal sections; and
   a lead frame package preform including
      at least one die pad surrounded by said spaced apart longitudinal and transverse sections of said metallic outer frame member such that a gap is formed around said die pad within said metallic outer frame member, and
      a plurality of spaced apart leads extending from said metallic outer frame member toward said die pad, each of said spaced apart leads having a first portion connected to said metallic outer frame member and distal from said die pad, a second portion proximal to and spaced apart from said die pad, a top surface extending from said first portion to said second portion, and a recess formed in said first portion and indented from said top surface; and
   an encapsulant filled in said recesses of said leads and said gap.

2. The lead frame device of claim 1, wherein said metallic outer frame member, said die pad and said spaced apart leads are made from a same material.

3. The lead frame device of claim 1, wherein said recesses of said first portions of said spaced apart leads are located on a scribing line configured to cut off said lead frame package preform from said metallic outer frame member.

4. The lead frame device of claim 3, wherein said lead frame package preform further includes a supporting segment having a segment first end that is connected to said die pad, a segment second end that is connected to said metallic outer frame member, and a segment top surface extending from said segment first end to said segment second end, said segment second end of said supporting segment is formed with a segment recess that is indented from said segment top surface and that is located on the scribing line, said encapsulant further filling said segment recess.

5. The lead frame device of claim 1, said die pad includes a base portion, a plurality of spaced apart posts protruding upward from said base portion, said encapsulant further filling spaces formed among said posts without covering top surfaces of said posts.

6. The lead frame device of claim 1, wherein said lead frame package preform further includes a metal layer that is formed on a surface of said die pad and said top surfaces of said leads, which are exposed from said encapsulant.

7. The lead frame device of claim 1, wherein said metallic outer frame member is made of one of copper, a copper-based alloy, and an iron-nickel based alloy.

8. A lead frame device assembly, comprising a plurality of said lead frame devices as defined in claim 1 arranged in an array in rows and columns, said pairs of said spaced apart longitudinal sections of said lead frame devices of each column being integrally formed and interconnected with each other, said pairs of said spaced apart transverse sections of said lead frame devices of each row being integrally formed and interconnected with each other.

* * * * *